United States Patent [19]

Little et al.

[11] Patent Number: 4,526,673
[45] Date of Patent: Jul. 2, 1985

[54] COATING METHOD

[75] Inventors: Roger G. Little, Bedford; Stanley R. Shanfield, West Newton, both of Mass.

[73] Assignee: Spire Corporation, Bedford, Mass.

[21] Appl. No.: 563,096

[22] Filed: Dec. 19, 1983

Related U.S. Application Data

[62] Division of Ser. No. 423,454, Sep. 24, 1982, Pat. No. 4,440,108.

[51] Int. Cl.$^3$ .............................................. C23C 15/00
[52] U.S. Cl. ............................ 204/192 E; 204/192 N
[58] Field of Search ........... 427/38; 204/192 N, 192 E

[56] References Cited

PUBLICATIONS

T. Takagi et al., "Ion Beam Technique and Applications" *Thin Solid Films* 63 (1979), pp. 41 et seq.
S. Aisenberg et al., "Ion-Beam Deposition of Thin Films of Diamonlike Carbon" *Journal of Applied Physics* vol. 42, No. 7 (Jun. 1971), pp. 2953-2958.
C. Weissmantel et al., "Structure & Properties of Quasi--Amorphous Films..." Thin Solid Films, 72 (1980) pp. 19-31.
C. Weissmantel, "Ion Beam Deposition of Special Film Structures" J. Vac, Sci. Technol., 18 (2), Mar. 1981, pp. 179-185.
G. Carter et al., "The Interaction of Low Energy Ion Beams With Surfaces," *Thin Solid Films*, 80 (1981) pp. 13-29.
M. Wakatsuki et al., "Synthesis of Polycrystalline Cubic BN" *Mat. Res. Bul.* vol. 7, Jul. 10, 1972 pp. 999-1004.
G. Gautherin et al., "Some Trends in Preparing Film Structure..." *Thin Solid Films*, 50 (1978), pp. 135 et seq.
C. Weissmantel et al., "Preparation of Hard Coatings by Ion Beam Methods," *Thin Solid Films*, 63 (1979) pp. 315-325.

Primary Examiner—Bernard D. Pianalto
Attorney, Agent, or Firm—Morse, Altman & Dacey

[57] ABSTRACT

A coating apparatus and method for coating industrial cutting and turning tools of any desired shape and configuration and the like significantly to improve the tools' working properties. The coating is formed of cubic boron nitride, with a preferred thickness not exceeding ten microns.

The coating apparatus includes an rf excited plasma source chamber having a gas feed ring for ionizing a gas admitted into the chamber via the ring. The preferred feedgas is a borazine and benzene vapor mixture. A coating chamber is mounted adjacent to and contiguous with the plasma source chamber via a neck portion. The coating chamber includes a vacuum interlock to permit the entry and removal of a tool transport. At least one vacuum pump is operatively connected to the chamber. Preferably, a plurality of permanent magnets and electron supply filaments are arranged circumferentially about the plasma source chamber. Preferably, the tool transport is rotatable during coating. Preferably, the apparatus is microprocessor controlled.

13 Claims, 6 Drawing Figures

COATING METHOD

This is a division, of application Ser. No. 423,454 filed on Sept. 24, 1982, U.S. Pat. No. 4,440,108.

BACKGROUND OF THE INVENTION

1. Field of the Invention

The present invention relates generally to coating apparatus and, more particularly to a method and apparatus for coating industrial cutting and turning tools and the like so as to improve the tools' working properties.

2. The Prior Art

Industrial society requires, among others, the use of lathe, milling and other industrial cutting and turning machines for the production of many goods. These machines in turn require hard-edged tooling. Such tooling must exhibit an acceptable cutting rate and a minimum useful life. Improvements in cutting rate and useful life of such tooling lead to improved productivity, hence lower manufacturing costs.

Initial efforts were directed at improving the composition of the materials from which the tools were shaped. These included, among others, the various high speed and hot-work steels and tungsten carbides. These initial efforts were followed by further enhancing the desired properties of these advanced materials by providing the tools formed from such materials by some sort of a coating. Depending on application, such coatings have included aluminum-oxide and titanium-nitride coatings for tungsten-carbide and diamondlike carbon coatings for hard alloy HG 10, steel and aluminum. See "Preparation of Hard Coatings by Ion Beam Methods," by C. Weissmantel et al, *Thin Solid Films*, 63 (1979) pp. 315-325.

More recently, cubic boron nitride (CBN) has received a great deal of attention as a most desired coating for such industrial tooling. This is so since CBN is the second hardest material known, just after diamond. CBN is comparable to diamond in hardness, compressive strength and in wear and abrasion resistance, and also is chemically inert at high temperatures. These qualities have made CBN into a promising material for forming such cutting and turning tools. See "Sythesis of Polycrystalline Cubic BN," by M. Wakatsuk, et al, *Mat. Res. Bull.*, Vol. 7, pp. 999-1004 (1972). CBN is, however, difficult to make. It requires high pressures and high temperatures. Although the ion beam deposition of CBN coatings onto hard alloy substrates recently has been investigated (see "Ion Beam Deposition of Special Film Structures," by C. Weissmantel, *J. Vac. Sci. Technol.*, 18(2), March 1981, and "Structure and Properties of Quasi-Amorphous Films Prepared by Ion Beam Techniques," by C. Weissmantel et al, *Thin Solid Films*, 72 (1980) pp. 19-31), the only known commercial method to coat industrial cutting and turning tools with CBN is the one developed by the General Electric Company. This GE commercial method also is based on high pressure and high temperature technology, and requires extensive processing. Consequently, CBN coated tools are very expensive. Further, the GE method can only coat tooling parts of relatively simple shape and configuration, its application is thus further restricted.

SUMMARY OF THE INVENTION

It is a principal object of the present invention to overcome the above disadvantages by providing a method and an apparatus for coating industrial cutting and turning tools in a practical and inexpensive way.

More specifically, it is an object of the present invention to provide a method and an apparatus for coating industrial cutting and turning tools and the like with a thin layer of cubic boron nitride comprising an rf (radio frequency) excited plasma source chamber with a gas feed ring at one end and a neck portion at the other, a coating chamber mounted adjacent and contiguous with the plasma source chamber via the neck portion, a plurality of permanent magnets and electron supply filaments circumferentially arranged about the plasma source chamber, vacuum pump means operatively connected to both chambers, and a vacuum interlock provided in the coating chamber. Preferably, the feedgas is a mixture of borazine and benzene vapor. Preferably, the tools to be coated are negatively biased, are heated, and are rotated when exposed to a beam of ions extracted from the rf excited plasma.

Preferably, the beam energy of the beam of ions is variable during the coating run. Preferably, the apparatus is microprocessor controlled.

Other and further objects of the present invention will in part be obvious and will in part appear hereinafter.

The invention accordingly comprises the method and the apparatus of the present disclosure, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENT

Figure 1:
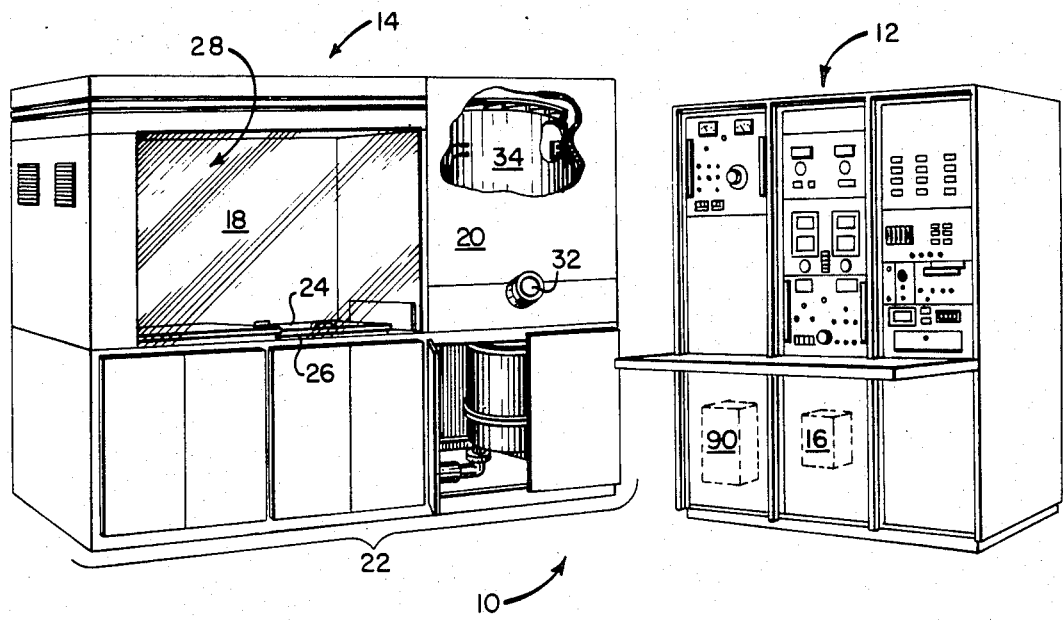
FIG. 1 is a perspective view of an apparatus for coating industrial cutting and turning tools constructed in accordance with the present invention.

Generally, the illustrated embodiment of an apparatus 10 for coating industrial cutting and turning tools and the like is shown in FIG. 1 as including two portions: a control portion 12 on the right and a work portion 14 on the left. The control portion 12, preferably of modular design, includes the control switches, gauges, meters, and readout systems necessary to control the operation of the coating apparatus 10, preferably with the aid of a microprocessor 16 disposed in the lower part of the control portion 12. The work portion 14 on the other hand preferably comprises a work handling section 18, a work coating section 20, and a supporting instrumentation section 22 generally located underneath the sections 18 and 20.

Parts (not shown) to be coated in and by the apparatus 10 preferably are positioned on a tray 24 by means of which they can be conveniently placed on a work transport 26 operatively mounted in the work handling section 18. Preferably, the work handling section 18 is completely enclosed all around, including a transparent front panel 28, made of glass or plastic. The front panel 28 can be hingelike mounted either along its top edge or along one of its side edges or may be secured in any other known manner. Preferably, the work handling section 18 is provided with a suitable exhaust and/or cooling system 30.

The work coating section 20 houses the instrumentality where the coating of the work parts is effected. A suitable observation window 32 preferably is provided at the work coating section 20 through which the coating operation may be observed and monitored. The coating instrumentality preferably is contained within a cylindrical member 34. Cylindrical member 34 preferably is formed with a plurality of cylindrical jackets 36, one of which jackets 36 is designed to cool, at least partially along its axial length, the innermost wall of the cylindrical member 34.

Figure 3:
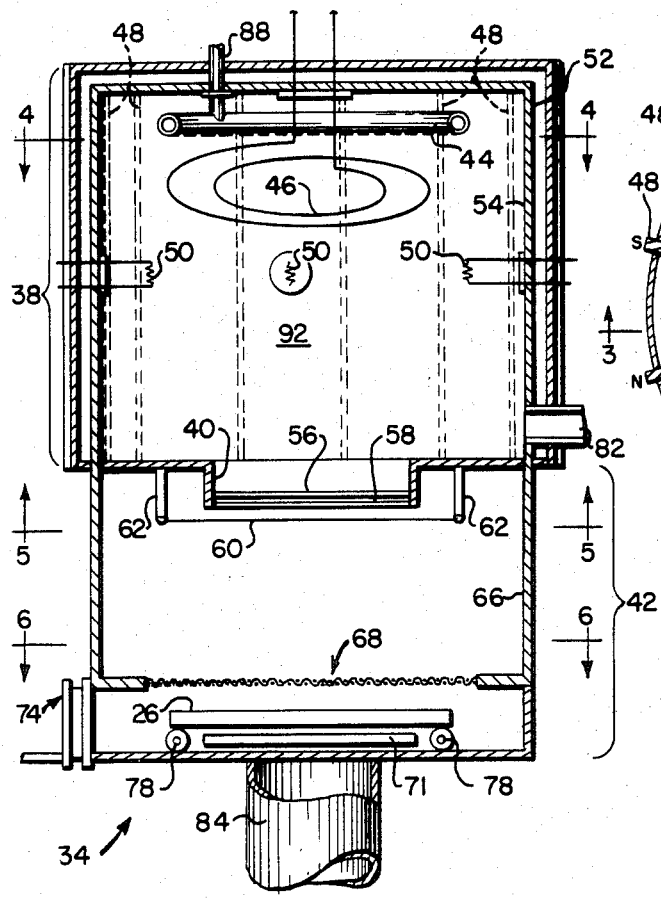
FIG. 3 is a vertical schematic view of a part of the apparatus shown in FIG. 1.
Figure 4:
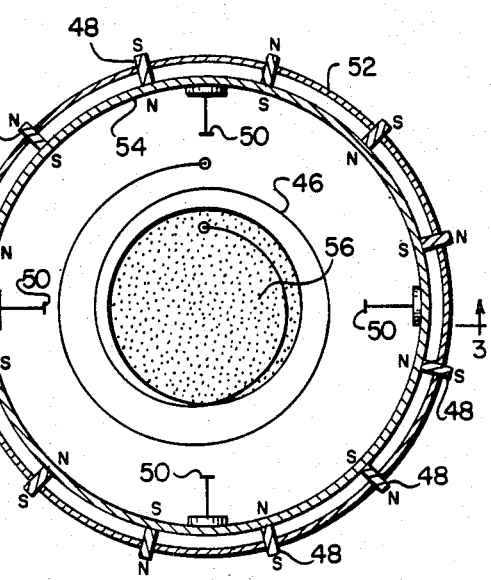
FIG. 4 is a top sectional view along the line and in the direction of the arrows 4—4 of FIG. 3.

A vertical schematic view of the cylindrical member 34 is shown in FIG. 3. Basically, the cylindrical member 34 comprises an rf excited plasma source chamber 38 having a neck portion 40, and a coating chamber 42 mounted adjacent and contiguous with the plasma source chamber 38 via the neck portion 40. The plasma source chamber 38 is provided with a gas feed ring 44 at its upper end, and with an rf antenna 46 located below the gas feed ring 44. The rf antenna 46 preferably is formed of a spiral copper tubing. A plurality of permanent magnets 48 and a plurality of electron supply filaments 50 are arranged circumferentially about the plasma source chamber 38. At least one cylindrical cooling jacket 52 is shown surrounding the plasma source chamber 38 and is designed to cool, from the outside, the innermost cylindrical wall 54 thereof. It is to be noted that this cylindrical wall 54 also functions as the anode, with the plurality of filaments 50 serving as the cathodes.

Figure 6:
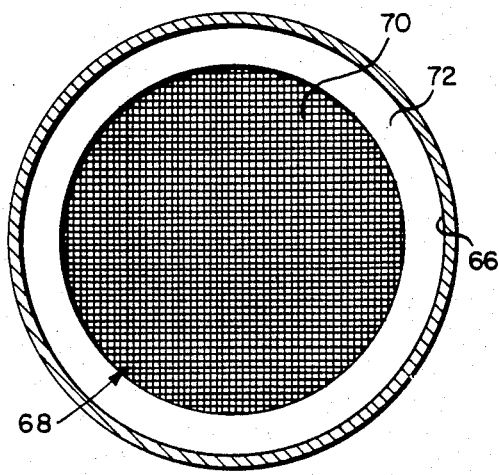
FIG. 6 is a sectional view along the line and in the direction of the arrows 6—6 of FIG. 3.
Figure 5:
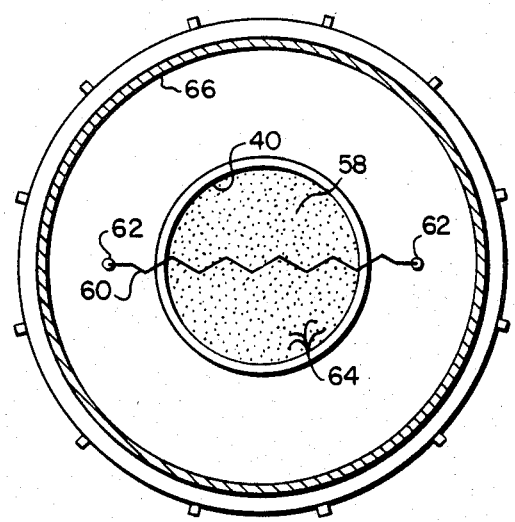
FIG. 5 is a bottom sectional view along the line and in the direction of the arrows 5—5 of FIG. 3.

In the neck portion 40 of the plasma source chamber 38, preferably a pair of parallel disposed extraction grids 56 and 58 are mounted. Immediately below the extraction grids 56 and 58, and within the coating chamber 42, is mounted a neutralizer filament 60, shown stretched across the neck portion 40 and secured in place by a pair of poles 62,62. As may be best observed in FIG. 5, each of the extraction grids 56 and 58 preferably is formed of stainless steel as a circular plate, having a multiplicity of fine apertures 64 therein. Spaced from the neutralizer filament 60 and secured to the inner cylindrical wall 66 of the coating chamber 42 is mounted an insulated ground screen 68. As may be best observed in FIG. 6, this ground screen 68 preferably is formed of a coarse metal screen 70 surrounded by an insulating ring 72. A vacuum interlock 74 is provided in the bottom section of the coating chamber 42 and communicating with the work handling section 18 so as to admit the work transport 26 and whatever is carried by the work transport 26 into the coating chamber. A suitable hydraulic or pneumatic means 76, located in the supporting instrumentation section 22 below the work handling section 18, is provided to move the work transport 26 from the work handling section 18 through the vacuum interlock 74 into the coating chamber 42. An appropriate anti-friction arrangement 78, representatively illustrated by a pair of rollers, also preferably is provided in the bottom of the coating chamber 42 to facilitate the translatory motion of the work transport 26. Further, the anti-friction arrangement 78 also is designed to allow for rotational displacement, at variable and adjustable rates, of the work transport 26 within the coating chamber 42. The means, not otherwise illustrated, designed to impart such variable and adjustable rate of rotation to the work transport 26 may comprise any known device and, may in fact be the anti-friction arrangement 78 itself. Further, a combination heating and negative biasing means 71 also is mounted, preferably underneath the work transport 26 when in the coating chamber 42, to heat the parts carried by the work transport 26 and also to provide a negative target bias to the parts to be coated.

A vacuum pump means 80 is mounted in the supporting instrumentation section 22 immediately below the cylindrical member 34. Preferably, the vacuum pump means 80 is a turbo-molecular pump of known design, although other designs may equally be employed. The vacuum pump means 80 is operatively connected to both the rf excited plasma source chamber 38 via a conduit 82 and the coating chamber 42 via a conduit 84. A source 86 of feedgas mixture also is mounted in the supporting instrumentation section 22 to supply a mixture of an appropriate feedgas to the gas feed ring 44 via a suitable fitting 88. The preferred feedgas is a mixture of borazine ($B_3 N_3 H_6$) vapor and benzene ($C_6 H_6$) vapor. Other feedgases may also be used, depending on the parts to be coated and their materials and/or intended applications. Although in the process of the invention, preferably no carrier gases are employed in the feedgas mixture, nevertheless certain alkane gases, notably butane, and certain noble gases, notably helium, as well as hydrogen may be used.

A power distribution center 90 preferably is located in the control portion 12 of the apparatus 10, adjacent the microprocessor 16. The power distribution center 90 provides the required power to all of the operative parts of the apparatus 10, including such major ones as the plasma arc power supply, the ion beam accelerator power supply, the electron filament power supply, and the vacuum pump power supply.

OPERATION

The coating apparatus 10 of the invention is operated as follows. An rf excited plasma discharge, fed by a mixture of borazine vapor ($B_3 N_3 H_6$) and benzene vapor ($C_6 H_6$) via the gas feed ring 44, is formed and maintained in a region 92 of the plasma source chamber 38 by and between the plurality of electron supply filaments 50 supplying electrons that are attracted to the cylindrical anode 54 represented by the innermost cylindrical wall of the chamber 28. Before reaching the cylindrical anode 54, the electrons collide with and ionize the neutral borazine and benzene vapor mixture. The efficiency of plasma production materially is increased by the plurality of permanent magnets 48. These permanent magnets 48 increase the path lengths of the electrons between the filaments 50 and the cylindrical anode 54 by the several magnetic fields, existing between adjacent magnets 48 of opposed polarity, imparting a generally spiral orbit to each of the electrons before they strike the anode 54. Consequently, each electron collides with and thus ionizes more neutral borazine and benzene atoms, more specifically the boron and the nitrogen atoms thereof, before reaching the anode 54 than would be the case without the presence of the plurality of permanent magnets 48.

Figure 2:
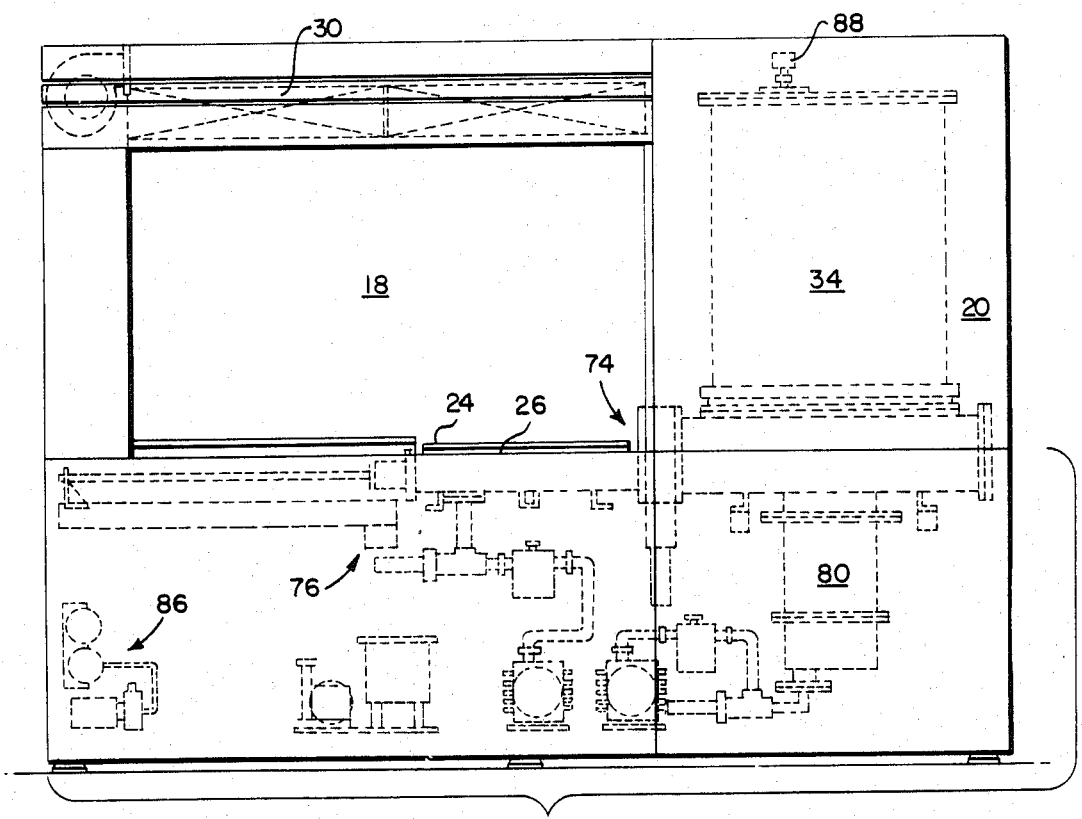
FIG. 2 is a front elevation of a portion of the apparatus of FIG. 1, showing certain of the operative parts thereof in phantom lines.

Since both borazine and benzene decompose at ambient temperature, the source 86 of the feedgas mixture in the supporting instrumentation section 22 (observe FIG. 2) preferably is maintained at normal refrigeration temperature of between about 34° F. to about 40° F. The plasma source chamber 38, on the other hand, is pumped down and maintained at a pressure of from about $10^{-5}$ to about $10^1$ torr, and preferably at about $5\times10^{-4}$ torr. Although preferably, no carrier gases are used, depending on the materials to be coated, such gases as butane, hydrogen or helium may be used in conjunction with the feedgas.

While the rf excited plasma is less sensitive to pyrolytic coating buildup on the cylindrical anode 54, it nevertheless is good practice to maintain the anode 54 at a temperature of about 550° C. or below by circulating an appropriate liquid coolant within the cylindrical cooling jacket 52. Further, the use of hydrogen or helium as a carrier gas also has the tendency to inhibit or at least to retard borazine pyrolysis from occurring on the anode 54.

The positive ions are extracted from the plasma through the extraction grids 56 and 58 maintained at a negative potential so as to produce an ion beam.

The ion beam current density from the plasma discharge can vary from about 0.5 to about 5 $mA/cm^2$, with 2 $mA/cm^2$ being preferred. Further, the beam energy of the generated ion beam can vary from about 200 to about 2,000 electron-volts, with about 800 eV being preferred when the beam energy is steady. When the beam energy is variable over the length of an average coating run of about fifty minutes, it preferably is being steadily increased from about 300 eV to about 1,200 eV over the first forty minutes of the run and then held there for the remainder ten minutes of the coating run. The beam diameter of the generated ion beam is at least about 20 cm up to about 50 cm, with the 50 cm beam diameter being preferred for production runs. To this end, it is desirable that the diameter of the neck portion 40 be at least 50 cm wide. The heated neutralizer filament 60, in generating roughly an equal number of electrons to the positive ions extracted through the grids 56 and 58, has the effect of reducing the net charge buildup on the work being coated to zero. This allows for better control over the evenness and the thickness of the coating on the work. The neutralization of the charge buildup also minimizes any stresses that might otherwise develop in the coating due to electrostatic effects. Further, the neutralization of the charge buildup allows the coating of insulators.

The coating chamber 42 is maintained at a negative pressure of from about $10^{-8}$ to about $10^{-2}$ torr, and preferably at about $10^{-6}$ torr. A negative potential applied to the work to be coated on the work transport 26 is used to attract the positive ions. This negative work bias, acting in cooperation with the effect of the ground screen 68 on the coating process, allows for the evenly coating of all edges and corners of the work, regardless of its geometry. The negative work bias may vary from about $-1$ VDC to about $-1,000$ VDC, with the preferred bias being about $-400$ VDC. The work, while being coated, may be at ambient temperature or, if desired, can be at an elevated temperature anywhere from ambient up to about 1,000° C., not exceeding, of course, the respective melting point of the work material. Such elevated work temperature enhances the desired properties of the coating, improves coating adhesion, and reduces the impurity and stress level in the applied coating. By continuously rotating the work transport 26 during a coating run, the evenness of the coating applied to the work is further assured. It also is of advantage to subject the work to cleaning before it is coated. Preferably, the cleaning of the work is effected either in-situ, such as by argon ion beam milling, or just immediately prior to the work being placed into the work handling section 18 of the apparatus 10.

The coating thickness applied to the work in the apparatus 10 can vary from about 0.1 micron to about ten microns, depending on the particular material of the work being coated, and also on the desired end result or use of the coated work. The work materials include the tungsten and the molybdenum high speed steels, the hot-work steels, the carbon tool sheets (whether of the low, medium or of the high carbon content), the tungsten carbides (both uncoated and coated with $Al_2O_3$ or TiN), the ceramics, the plastics, quartz, diamondlike carbon, and semiconductor materials.

The parts to be coated include industrial cutting and turning tools, such as tool bits, drill bits, machining bits, grinding wheels, chisels, saw blades, razor blades, surgical tools, ball bearings, abrasives and the like, as well as semiconductor wafers desired to be coated with a low residual stress photolithographic masking.

It has been observed that the thin coating of cubic boron nitride (CBN) applied to such industrial cutting and turning tools materially enhanced their desired physical properties, including their hardness, abrasion resistance, thermal and mechanical shock resistance, and their chemical behavior, which remained inert, even at elevated temperatures, when exposed to nitric, hydrofloric or sulphuric acids. Further, the applied coatings could not be removed even by sand blasting.

Of course, by changing the particular feedgas from the preferred mixture of borazine and benzene vapor to other feed vapors or combinations of feed vapors, work parts introduced into the apparatus 10 may be coated with compounds other than CBN.

In order to maintain a stable, well defined deposition rate of about one micron per ten to twelve minutes, the apparatus 10 preferably is provided with a system for feedback stabilization of the ion beam current density during coating runs. This is preferably effected by feeding the ion beam current signal back to the rf antenna 46 to control the power of the rf excitation source in the plasma source chamber 38.

Thus it has been shown and described a coating appartus 10 and method for coating industrial cutting and turning tools and the like, which apparatus 10 satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A process of coating parts comprising:
   (a) positioning a plurality of parts on a work transport;
   (b) introducing said plurality of parts with said work transport into a coating chamber maintained under vacuum;
   (c) subjecting said plurality of parts to cleaning by ion beam milling in an inert gas environment;
   (d) providing a negative bias to said plurality of parts in said coating chamber;

(e) exposing said plurality of negatively biased parts within said coating chamber to a beam of ions extracted from an rf excited plasma acting on a feed as introduced into a second chamber adjacent and contiguous with said coating chamber for a time period not exceeding sixty minutes; and (f) progressively increasing the beam energy of said beam of ions from about 300 electron-volts to about 1200 electron-volts while said plurality of negatively biased parts are being exposed thereto.

2. The process of claim 1 wherein said parts to be coated are of any desired shape and configuration.

3. The process of claim 1 wherein said parts are formed of any one of the group including: steels, tungsten carbides, ceramics, plastics, quartz, carbon tool sheets, titanium-nickel or titanium-carbide or aluminum-oxide coated metals, diamond-like carbon, and semiconductor materials.

4. The process of claim 1 wherein said parts include industrial cutting and turning tools, such as tool bits, drill bits, machining bits, grinding wheels, chisels, saw blades, razor blades, surgical tools, ball bearings, abrasives and the like.

5. The process of claim 1 wherein the pressure of said coating chamber maintained under vacuum is from about $10^{-8}$ to about $10^{-2}$ torr.

6. The process of claim 1 wherein said negative bias is from about $-1$ to about $-1000$ VDC.

7. The process of claim 1 wherein said ion beam has a diameter of from about 20 to about 50 cm, a beam energy of up to 2000 electron-volts, a beam current density of from about 0.5 to about 5 mA/cm$^2$.

8. The process of claim 1 wherein said feedgas is a mixture of borazine vapor and benzene vapor, and the resultant coating on said parts is cubic boron nitride.

9. The process of claim 8 wherein said feedgas also contains hydrogen.

10. The process of claim 8 wherein said feedgas also contains helium.

11. The process of claim 1 wherein said second chamber also is maintained under vacuum at a pressure from about $10^{-5}$ to about $10^1$ torr, and wherein the outside of said second chamber is cooled to below 550° C.

12. The process of claim 1 wherein said negatively biased parts within said coating chamber also are rotated while being exposed to said beam of ions.

13. The process of claim 1 wherein said plurality of negatively biased parts within said coating chamber also are heated to a temperature of at least about 25° C. but not exceeding about 1000° C.

* * * * *